(12) United States Patent
Lin et al.

(10) Patent No.: US 10,475,742 B2
(45) Date of Patent: Nov. 12, 2019

(54) METHOD FOR FORMING SEMICONDUCTOR DEVICE STRUCTURE HAVING CONDUCTIVE STRUCTURE WITH TWIN BOUNDARIES

(71) Applicant: TAIWAN SEMICONDUCTOR MANUFACTURING COMPANY, LTD., Hsinchu (TW)

(72) Inventors: Jian-Hong Lin, Huwei (TW);
Chwei-Ching Chiu, Hsinchu (TW);
Yung-Huei Lee, New Taipei (TW);
Chien-Neng Liao, Taichung (TW);
Yu-Lun Chueh, Hsinchu (TW);
Tsung-Cheng Chan, Nantou (TW);
Chun-Lung Huang, Minxiong Township (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 16/205,997

(22) Filed: Nov. 30, 2018

(65) Prior Publication Data

US 2019/0103351 A1    Apr. 4, 2019

Related U.S. Application Data

(60) Continuation of application No. 15/672,780, filed on Aug. 9, 2017, now Pat. No. 10,283,450, which is a
(Continued)

(51) Int. Cl.
*H01L 23/48* (2006.01)
*H01L 23/528* (2006.01)
(Continued)

(52) U.S. Cl.
CPC ........ *H01L 23/528* (2013.01); *H01L 21/2885* (2013.01); *H01L 21/76802* (2013.01);
(Continued)

(58) Field of Classification Search
CPC ..................................................... H01L 23/528
(Continued)

(56) References Cited

U.S. PATENT DOCUMENTS 6,126,806 A * 10/2000 Uzoh .................. H01L 21/2885
205/157
6,670,639 B1 * 12/2003 Okabayashi ...... H01L 23/53228
257/64
(Continued)

OTHER PUBLICATIONS

Hsiang-Yao Hsiao, "Unidirectional Growth of Microbumps on (111)-Oriented and Nanotwinned Copper", Science May 25, 2012, vol. 336, Issue 6084, pp. 1007-1010 (Year: 2012).*
(Continued)

*Primary Examiner* — Caleb E Henry
(74) *Attorney, Agent, or Firm* — Hauptman Ham, LLP

(57) ABSTRACT

A method of forming a semiconductor device structure includes: forming a first conductive structure over a substrate, the first conductive structure including twin boundaries; and wherein the forming the first conductive structure includes manipulating process conditions so as to promote formation of the twin boundaries resulting in a promoted density of twin boundaries such that the first conductive structure has an increased failure current density (FCD) relative to a baseline FCD of an otherwise substantially corresponding second conductive structure which has an unpromoted density of twin boundaries, the unpromoted density being less than the promoted density and such that the first conductive structure has a resistance which is substantially the same as the second conductive structure.

20 Claims, 9 Drawing Sheets

Related U.S. Application Data division of application No. 14/832,055, filed on Aug. 21, 2015, now Pat. No. 9,761,523.

(51) Int. Cl.
*H01L 23/532* (2006.01)
*H01L 21/288* (2006.01)
*H01L 21/768* (2006.01)

(52) U.S. Cl.
CPC .. *H01L 21/76831* (2013.01); *H01L 21/76843* (2013.01); *H01L 21/76877* (2013.01); *H01L 21/76879* (2013.01); *H01L 21/76883* (2013.01); *H01L 23/53223* (2013.01); *H01L 23/53238* (2013.01); *H01L 23/53252* (2013.01); *H01L 23/53266* (2013.01); *H01L 21/76834* (2013.01); *H01L 21/76849* (2013.01)

(58) Field of Classification Search
USPC ........................................................ 257/751
See application file for complete search history.

(56) References Cited

U.S. PATENT DOCUMENTS

| | | | | |
|---|---|---|---|---|
| 8,012,861 | B2* | 9/2011 | Im | C23C 14/5813 257/E21.134 |
| 8,221,544 | B2* | 7/2012 | Im | B23K 26/0738 117/9 |
| 8,426,296 | B2* | 4/2013 | Im | C30B 28/08 257/E21.413 |
| 8,617,313 | B2* | 12/2013 | Im | B23K 26/0738 117/202 |
| 2003/0226121 | A1* | 12/2003 | Yokogawa | G06F 17/5036 716/115 |
| 2006/0254500 | A1* | 11/2006 | Im | B23K 26/0738 117/43 |
| 2007/0075321 | A1* | 4/2007 | Konno | H01L 33/14 257/86 |
| 2007/0103038 | A1* | 5/2007 | Kamijo | H03H 9/02559 310/364 |
| 2009/0137105 | A1* | 5/2009 | Im | C23C 14/5813 438/487 |
| 2010/0032797 | A1* | 2/2010 | Takewaki | H01L 23/5256 257/529 |
| 2012/0045191 | A1* | 2/2012 | Im | C30B 28/08 392/419 |
| 2012/0135260 | A1* | 5/2012 | Jang | C25D 5/022 428/546 |
| 2013/0122326 | A1* | 5/2013 | Chen | C30B 7/12 428/641 |
| 2013/0270121 | A1 | 10/2013 | Liao et al. | |
| 2014/0021505 | A1* | 1/2014 | Huang | H01L 33/02 257/98 |
| 2014/0090880 | A1* | 4/2014 | Chen | H05K 1/09 174/257 |
| 2015/0064496 | A1* | 3/2015 | Chen | C30B 7/12 428/641 |
| 2015/0233019 | A1* | 8/2015 | Zhang | C30B 29/68 428/612 |
| 2015/0275350 | A1* | 10/2015 | Ott | C23C 14/165 204/192.15 |
| 2016/0082418 | A1* | 3/2016 | Qin | B22F 1/0025 502/330 |
| 2016/0133573 | A1* | 5/2016 | He | H01L 23/53238 257/762 |
| 2018/0050324 | A1* | 2/2018 | Qin | B22F 1/0025 |

OTHER PUBLICATIONS

Chen et al., "Observation of Atomic Diffusion at Twin-Modified Grain Boundaries in Copper", Science, American Association for the Advancement of Science, vol. 321, Aug. 22, 2008, pp. 1066-1069.

Lu et al., "Ultrahigh Strength and High Electrical Conductivity in Copper", Science, American Association for the Advancement of Sciences, vol. 304, Apr. 16, 2004, pp. 422-426.

Tagami et al., "Highly-Reliable Low-Resistance Cu Interconnects with PVD-Ru/Ti Barrier Metal Toward Automotive LSIs", IEEE, Interconnect Technology Conference, 2008, pp. 205-207.

* cited by examiner

METHOD FOR FORMING SEMICONDUCTOR DEVICE STRUCTURE HAVING CONDUCTIVE STRUCTURE WITH TWIN BOUNDARIES

PRIORITY CLAIM

The present application is a continuation of U.S. application Ser. No. 15/672,780, filed Aug. 9, 2017, now U.S. Pat. No. 10,283,450, granted May 7, 2019, which is a divisional of U.S. application Ser. No. 14/832,055, filed Aug. 21, 2015, now U.S. Pat. No. 9,761,523, granted Sep. 12, 2017, each of which is incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

The size of semiconductor devices has been continuously reduced in the fabrication process in order to increase device density. Accordingly, a multi-layered interconnect structure is provided. The interconnect structure may include one or more conductive lines and via layers.

Although existing interconnect structures and methods of fabricating interconnect structures have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
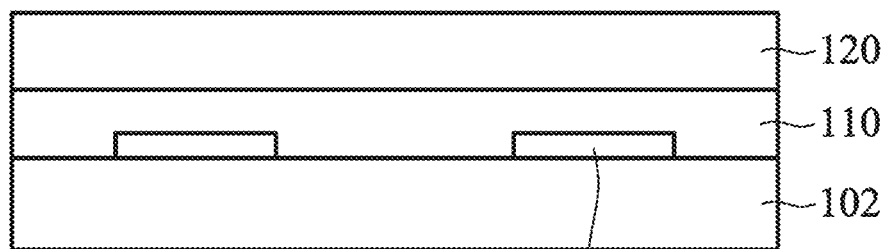
FIGS. 1A-1D show cross-sectional representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor device structure and method for forming the same are provided. FIGS. 1A-1D show cross-sectional representations of various stages of forming a semiconductor device structure 100a, in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The semiconductor device structure 100a includes a first dielectric layer 110 over the substrate 102. In some embodiments, the first dielectric layer 110 is an inter-layer dielectric (ILD) layer. The first dielectric layer 110 is made of silicon oxide (SiOx), silicon nitride (SixNy) or silicon oxynitride (SiON).

The device elements 104 are formed in the first dielectric layer 110. The device elements 104 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements 104, such as deposition, etching, implantation, photolithography, annealing, and/or other applicable processes. In some embodiments, device elements 104 are formed in the substrate 102 in a front-end-of-line (FEOL) process.

The substrate 102 may include various doped regions such as p-type wells or n-type wells). Doped regions may be doped with p-type dopants, such as boron or $BF_2$, and/or n-type dopants, such as phosphorus (P) or arsenic (As). The doped regions may be formed directly on the substrate 102, in a P-well structure, in an N-well structure, or in a dual-well structure.

The substrate 102 may further include isolation features (not shown), such as shallow trench isolation (STI) features or local oxidation of silicon (LOCOS) features. Isolation features may define and isolate various device elements.

A second dielectric layer 120 is formed over the first dielectric layer 110. In some embodiments, the second dielectric layer 120 is an inter-layer metal (IMD) layer. The second dielectric layer 120 may be a single layer or multiple layers. The second dielectric layer 120 is made of silicon oxide (SiOx), silicon nitride (SixNy), silicon oxynitride (SiON), dielectric material(s) with low dielectric constant (low-k), or combinations thereof.

In some embodiments, the second dielectric layer 120 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the second dielectric layer 120 is deposited by a chemical vapor deposition process (such as plasma enhanced chemical vapor deposition, PECVD) process or by a spin coating process.

Figure 1B:
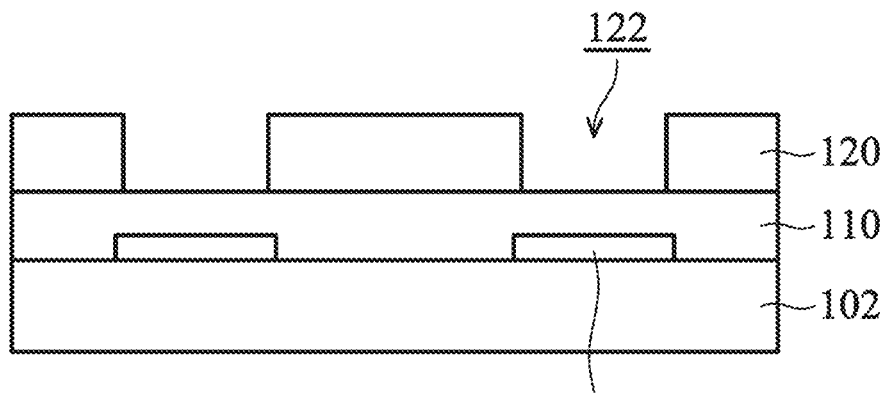

After the second dielectric layer 120 is formed, a trench 122 is formed in the second dielectric layer 120 as shown in FIG. 1B, in accordance with some embodiments of the disclosure. The trench 122 is formed by a patterning process. The patterning process includes a photolithography process and an etching process. Photolithography process includes soft baking, mask aligning, exposure, post-exposure baking, developing the photoresist, rinsing and drying (e.g., hard baking). The etching process includes dry etching or wet etching process.

Figure 1C:
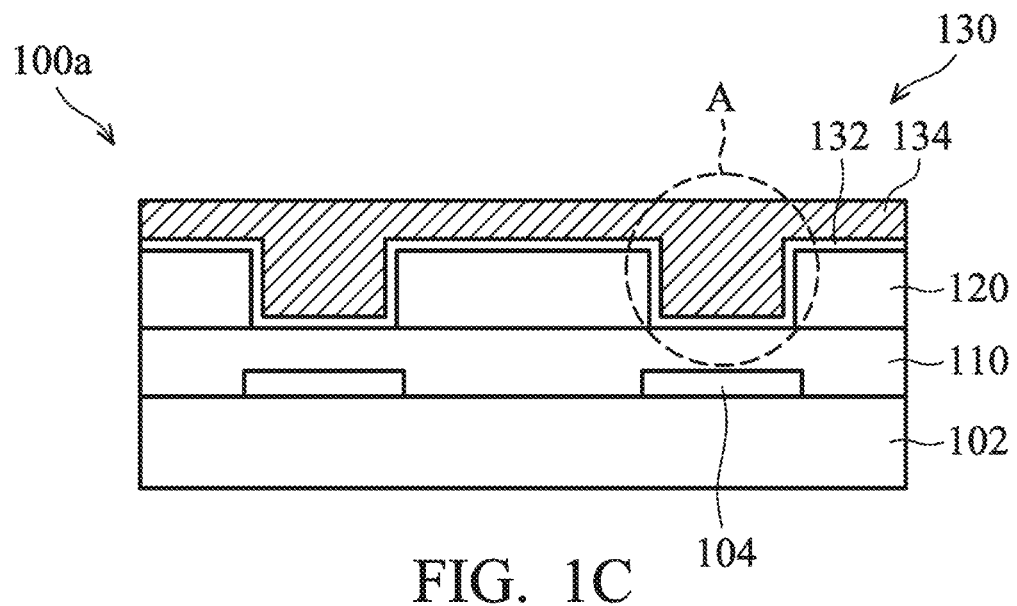

After the trench 122 is formed, a conductive structure 130 is formed in the trench 122 and over the second dielectric layer 120 as shown in FIG. 1C, in accordance with some embodiments of the disclosure. The conductive structure 130 is a portion of an interconnect structure. The interconnect structure is used to electrically connect the signal of the device elements 104 to outer device (not shown). The conductive structure 130 is electrically connected to the device elements 104.

The conductive structure 130 shown is merely for illustrative purposes. The conductive structure 130 may include other configurations and may include one or more conductive lines and via layers.

The conductive structure 130 includes a diffusion barrier layer 132 and a conductive material 134. The diffusion barrier layer 132 is used to prevent diffusion of the conductive material 134 into the adjacent areas. The second dielectric layer 120, the diffusion barrier layer 132 and the conductive material 134 are formed in a back-end-of-line (BEOL) process.

In some embodiments, the conductive material 134 is made of metal, such as copper (Cu), copper alloy, aluminum (Al), aluminum alloy, tungsten (W), tungsten alloy, titanium (Ti), titanium alloy, tantalum (Ta) or tantalum alloy, silver (Ag) or silver alloy, gold (Au) or gold alloy. In some embodiments, when the conductive material 134 is made of copper (Cu) or copper based alloy, the conductive material 134 has improved resistance values for propagating signals through the copper (Cu) interconnect at high speed.

It should be noted that the migration of the conductive structure 130 is classified into the "electromigration (EM)" caused by a direct current and the "stress migration (SM)" caused by a residual stress which has been produced in forming multiple-layers wiring. The "electromigration (EM)" and "stress migration (SM)" are two factors to evaluate the reliability of the conductive structure 130.

The term "electromigration (EM)" refers to a diffusion phenomenon which is based on an interaction between metal atoms in the interconnect structure (such as conductive structure 130 and electrons moving in the interconnect structure. In particular, the electromigration (EM) is a phenomenon where the metal atoms migrate in the same direction as that of the electron movement. When EM occurs, the migration of the metal atom will cause an atomic vacancy or void or will cause a hillock. When such voids are formed, the cross-sectional area of the conductive material will be decreased and the current density in the conductive material will be increased. The electromigration (EM) may increase resistivity of the device and degrade the performance of the device.

When various materials with different thermal expansion coefficients are formed in the interconnect structure, and therefore "stress migration (SM)" occurs due to the formation of stress between different materials. Voids form as result of vacancy migration driven by the hydrostatic stress gradient. As a result, some small voids are formed in the interconnect structure (such as conductive structure 130). These small voids can collectively form into a large void. Large voids reduce or eliminate electrical contact between the metal layers. In another example, stress migration (SM) may be caused by thermal cycling and process variations such as improper annealing, chemical mechanical polish ("CMP") processes, the conductive material fillings, or the like. Thus, stress migration may cause reduced electrical contact between conductive materials, which causes increased resistivity and can lead to device failure.

The electromigration (EM) and stress migration (SM) reliability issues become serious as geometries of the semiconductor device continue to shrink. In order to improve the electromigration (EM) reliability and stress migration (SM) reliability, the conductive structure 130 includes high density twin boundaries to suppress the electromigration (EM) and stress migration (SM).

Figure 2:
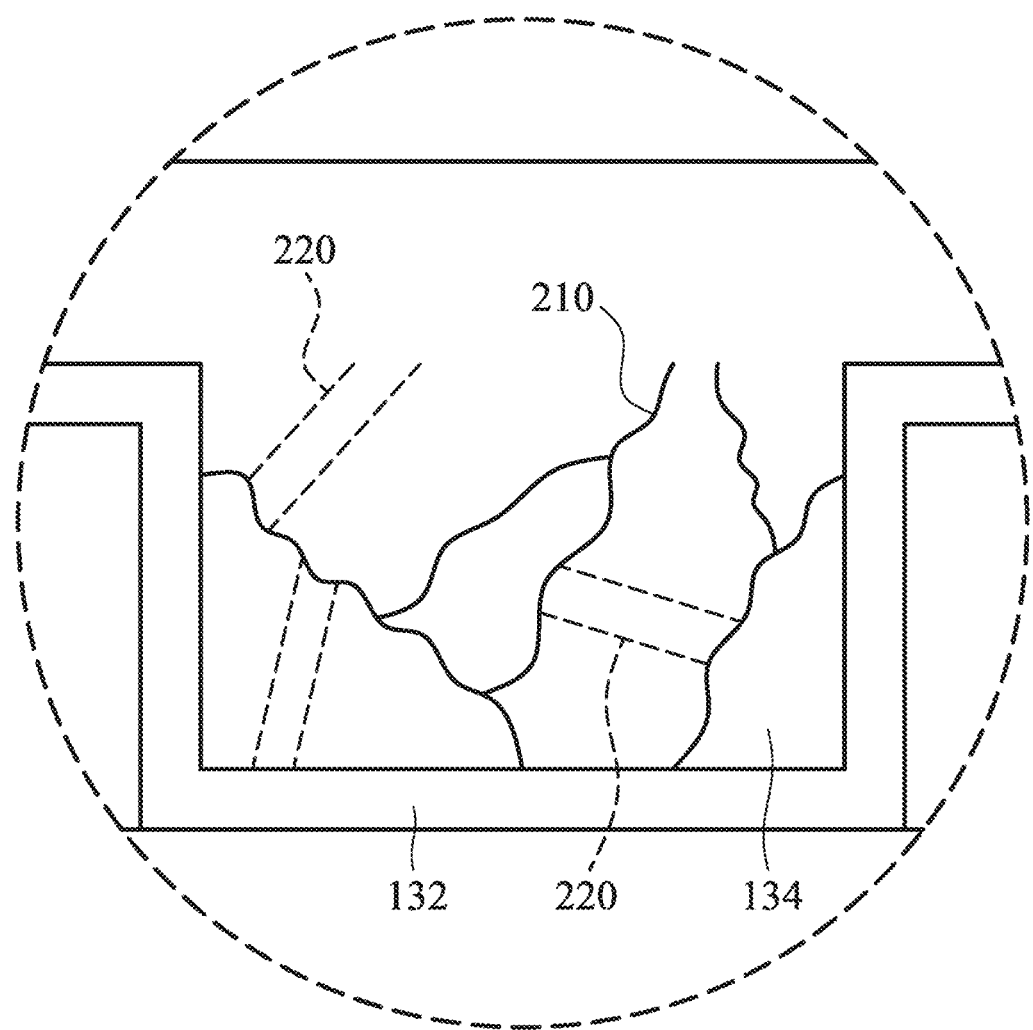
FIG. 2 shows an enlarged representation of a region A of FIG. 1C, in accordance with some embodiments of the disclosure.

FIG. 2 shows an enlarged representation of a region A of FIG. 1C, in accordance with some embodiments of the disclosure. The conductive structure 130 has some defects including grain boundaries 210 (shown in solid line) and twin boundaries 220 (shown in dashed line). The twin boundaries 220 are used to delay the migration of atoms of the conductive materials of the conductive structure 130 when voltage is applied to the conductive structure 130. Once the migration rate of atoms of the conductive materials is restrained by twin boundaries, the electromigration (EM) is reduced, and the stress migration (SM) is also reduced. In some embodiments, a density of twin boundaries 220 is in a range from about 25 µm$^{-1}$ to about 250 µm$^{-1}$. If the density of twin boundaries 220 is lower than 25 µm$^{-1}$, the electromigration (EM) of the conductive structure 130 may not be reduced. If the density of twin boundaries 220 is larger than 250 µm$^{-1}$, the defects may be too large, and therefore the adhesion between the diffusion barrier layer 132 and the conductive material 134 may be degraded. The density of the twin boundaries 220 is defined by number of twin boundaries 220 per unit length. In some embodiments, the density of twin boundaries 220 is measured by transmission electron microscopy (TEM).

In some embodiments, the twin boundaries 220 have an average twin-lamella width in a range from about 4 nm to about 40 nm. If the twin-lamella width is smaller than 4 nm, the defects may be too large, and therefore the adhesion between the diffusion barrier layer 132 and the conductive material 134 may be degraded. If the twin-lamella width is larger than 40 nm, the electromigration (EM) of the conductive structure 130 may not be reduced efficiently.

Furthermore, when the density of the twin boundaries 220 is within the above-mentioned range, the resistance of the conductive material 134 is maintained. The resistivity is not changed even the defect of the conductive material 134 is increased, compared with the conductive material 134 with no twin boundary.

The twin boundaries 220 may be formed by two processes. The first process is an on-time process, and the second process is an off-time process. The on-time process means that the twin boundaries 220 are created during formation of the conductive material 134. The off-time process means that the twin boundaries 220 are created after the conductive material 134 is formed.

In some embodiments, the twin boundaries 220 of the conductive material 134 are formed by the on-time process. The on-time process includes performing an electrodeposition process by a pulse current method. The substrate 102 and an electrode are disposed in an electrolyte, and the electrodeposition process is conducted at a controlled temperature. The substrate 102 and the electrode respectively function as the cathode and anode. Afterwards, a pulse current is applied to the substrate 102, and the conductive material 134 is deposited on the diffusion barrier layer 132.

In some embodiments, the electrolyte is a copper sulfate solution. In some embodiments, the electrodeposition process is operated at a temperature in a range from about −5 degrees to about 5 degrees. If the temperature is lower than −5 degrees, the electrolyte may be frozen. If the temperature is higher than 5 degrees, the polycrystalline structure rather than twin boundaries 220 may be formed. In some embodiments, the pulse current has a current density in a range from about 0.4 A/cm$^2$ to about 1.8 A/cm$^2$. If the pulse current is smaller than 0.4 A/cm$^2$, the density of twin boundaries 220 may be too small. If the pulse current is greater than 1.8 A/cm$^2$, the polycrystalline structure rather than twin boundaries 220 may be formed. In some embodiments, the pulse current is operated for a period of time in a range from about 0.02 seconds to about 0.2 seconds. If the period of time is shorter than 0.02 seconds, the twin boundaries 220 may not be formed. If the period of time is longer than 0.2 seconds, the density of twin boundaries 220 may be too small.

The pulse current increases the probability of stacking faults during formation of the conductive material 134. The temperature is controlled in the above-mentioned range to facilitate formation of nucleation sites of the twin boundaries 220.

In some other embodiments, when the conductive material 134 is formed by on-time process, the diffusion barrier layer 132 is made of titanium (Ti), titanium nitride (TiN), tantalum (Ta), tantalum nitride (TaN), tungsten nitride (WN), and combinations thereof.

In some other embodiments, the twin boundaries 220 of the conductive material 134 are formed by the off-time process, and the material of the diffusion barrier layer 132 is used to induce the formation of the twin boundaries 220. The diffusion barrier layer 132 and the conductive material 134 are made of different materials, and therefore have different lattice constants. The lattice constant difference between the diffusion barrier layer 132 and the conductive material 134 may cause some defects in the conductive material 134 after an annealing process is performed on the conductive structure 130.

As mentioned above, the lattice constant difference between the diffusion barrier layer 132 and the conductive material 134 is used to induce to form the twin boundaries (or twin structure) in the conductive material 134. In some embodiments, a lattice mismatch ratio between a lattice constant of the diffusion barrier layer 132 and a lattice constant of the conductive material 134 is in a range from about 0.1% to about 6%. If the lattice mismatch ratio is less than 0.1%, the density of the twin boundaries 220 may be too low. If the lattice mismatch ratio is greater than 6%, the adhesion between the diffusion barrier layer 132 and the conductive material 134 may degrade. Therefore, delamination problems may occur.

In some embodiments, when the conductive material 134 is made of copper (Cu) with a face-centered cubic (fcc) crystal structure, the diffusion barrier layer 132 is made of ruthenium (Ru), nickel (Ni), α-cobalt (Co), β-cobalt (Co), cobalt nitride (Co$_4$N) or combinations thereof. In some embodiments, the diffusion barrier layer 132 is a bi-layered structure, and tantalum (Ta) and ruthenium (Ru) are sequentially formed in the trench 122.

Table 1 shows the crystal structure and the lattice constant of various material of diffusion barrier layer 132. As shown in Table 1, the percentage difference between the lattice constants of copper (Cu) and various materials is calculated.

TABLE 1

| material | crystal structure | lattice constant (Å) | Lattice mismatch (%) |
|---|---|---|---|
| Copper (Cu) | fcc | 3.615 | 0% |
| ruthenium (Ru) | hcp | 3.827 | 5.9% |
| nickel (Ni) | fcc | 3.523 | 2.5% |
| α-cobalt (Co) | fcc | 3.545 | 1.9% |
| β-cobalt (Co) | hcp | 3.544 | 2.0% |
| cobalt nitride (Co$_4$N) | fcc | 3.586 | 0.8% |

In some embodiments, the diffusion barrier layer 132 is formed by a physical vapor deposition (PVD), chemical vapor deposition (CVD), atomic layer deposition (ALD) or another applicable process.

After deposition of the diffusion barrier layer 132, the conductive material 134 is formed over the diffusion barrier layer 132. Afterwards, an annealing process is performed on the conductive structure 130. In some embodiments, the annealing process is operated at a temperature in a range from about 150 degrees to about 400 degrees. If the temperature is lower than 150 degrees, the twin boundaries may not be formed. If the temperature is higher than 400 degrees, the diffusion barrier quality should be degraded. In some embodiments, the annealing process is operated for a period of time in a range from about 1 minute to 1 hour. If the period of time is shorter than 1 minute, the twin boundaries may not be formed. If the period of time is longer than 1 hour, the diffusion barrier quality should be degraded.

Figure 1D:
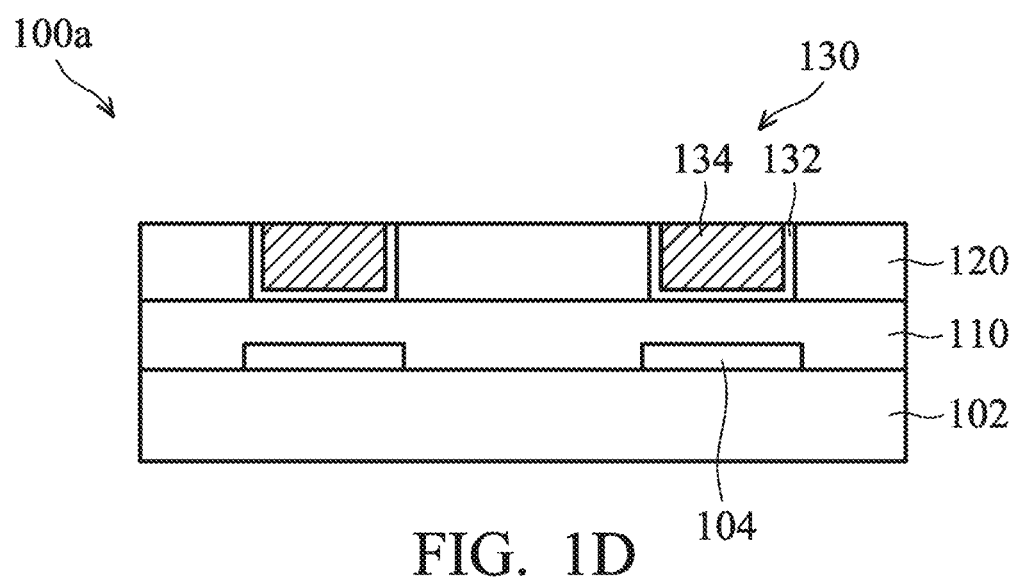

After the conductive material 134 is formed, a polishing process is performed on the conductive material 134 as shown in FIG. 1D, in accordance with some embodiments of the disclosure. The excess materials out of the trench 122 are removed. As a result, the top surface of the conductive material 134 is level with the top surface of the second dielectric layer 120. In some embodiments, the polishing process is a chemical polishing process (CMP).

Afterwards, the processing steps of FIGS. 1B-1D may be repeated to construct a multi-level dual damascene metal interconnect structure (not shown). When the multi-level conductive materials all have high twin boundaries density, the reliability of the semiconductor device structure will be further improved.

Figure 3A:
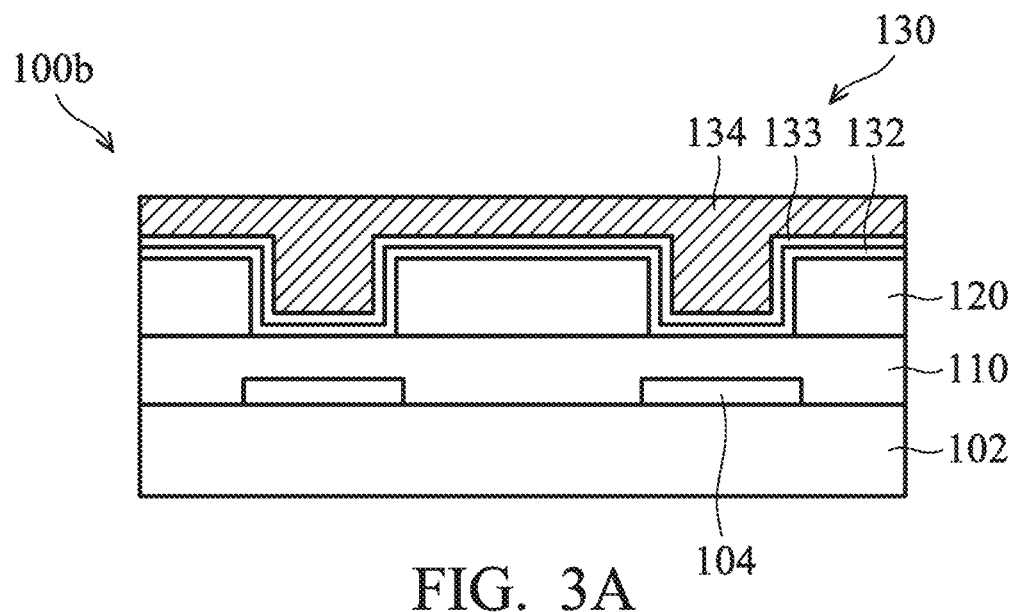
FIG. 3A-3B shows a cross-sectional representation of a semiconductor device structure, in accordance with some embodiments of the disclosure.
Figure 3B:
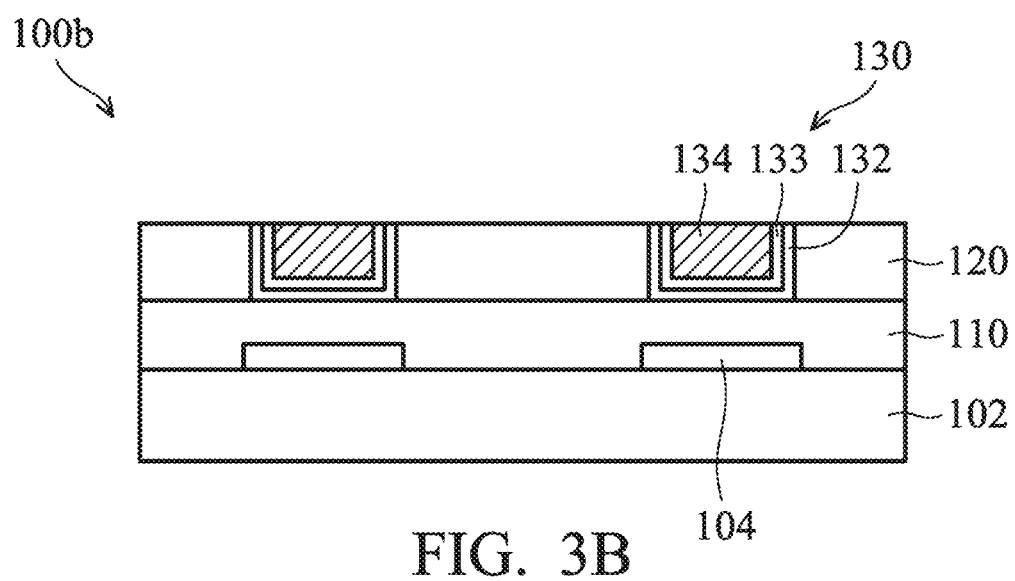

FIG. 3A-3B shows a cross-sectional representation of a semiconductor device structure 100b, in accordance with some embodiments of the disclosure. The semiconductor structure 100b is similar to, or the same as, the semiconductor structure 100a shown in FIG. 1D, except a glue layer 133 is formed over the diffusion barrier layer 132. Processes and materials used to form semiconductor structure 100b may be similar to, or the same as, those used to form the semiconductor structure 100a and are not repeated herein.

As shown in FIG. 3A, the glue layer 133 is formed between the diffusion barrier layer 132 and the conductive material 134. The glue layer 133 is used to improve the adhesion between the diffusion barrier layer 132 and the conductive material 134.

In some embodiments, a lattice mismatch ratio between a lattice constant of the glue layer 133 and a lattice constant of the conductive material 134 is in a range from about 0.1% to about 6%. When the lattice mismatch ratio is between the above-mentioned range, the twin boundaries 220 of the conductive material 134 may be formed easily.

Afterwards, a portion of the conductive material 134, the glue layer 133 and the diffusion barrier layer 132 are removed as shown in FIG. 3B, in accordance with some embodiments of the disclosure.

Figure 4A:
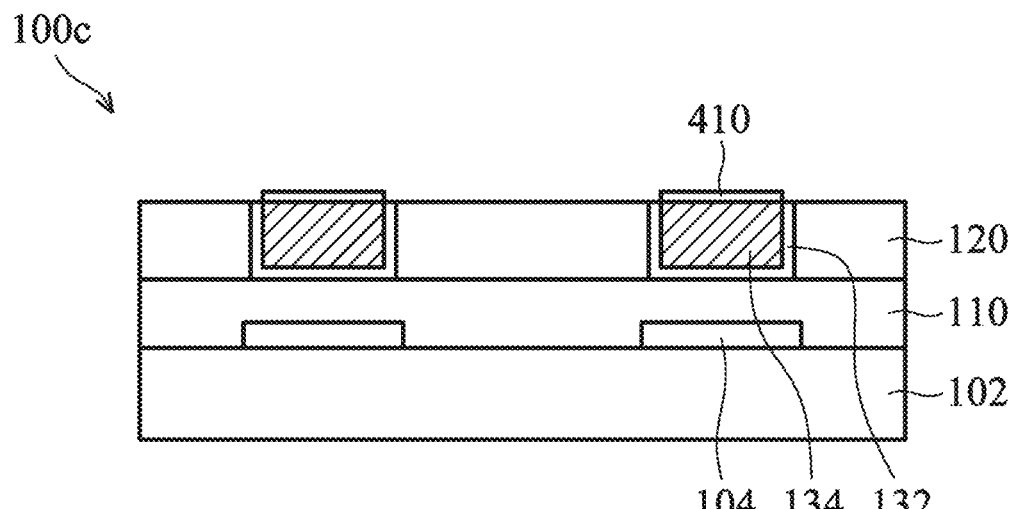
FIGS. 4A-4C show cross-sectional representations of various stages of forming a semiconductor device structure, in accordance with some embodiments of the disclosure.
Figure 4B:
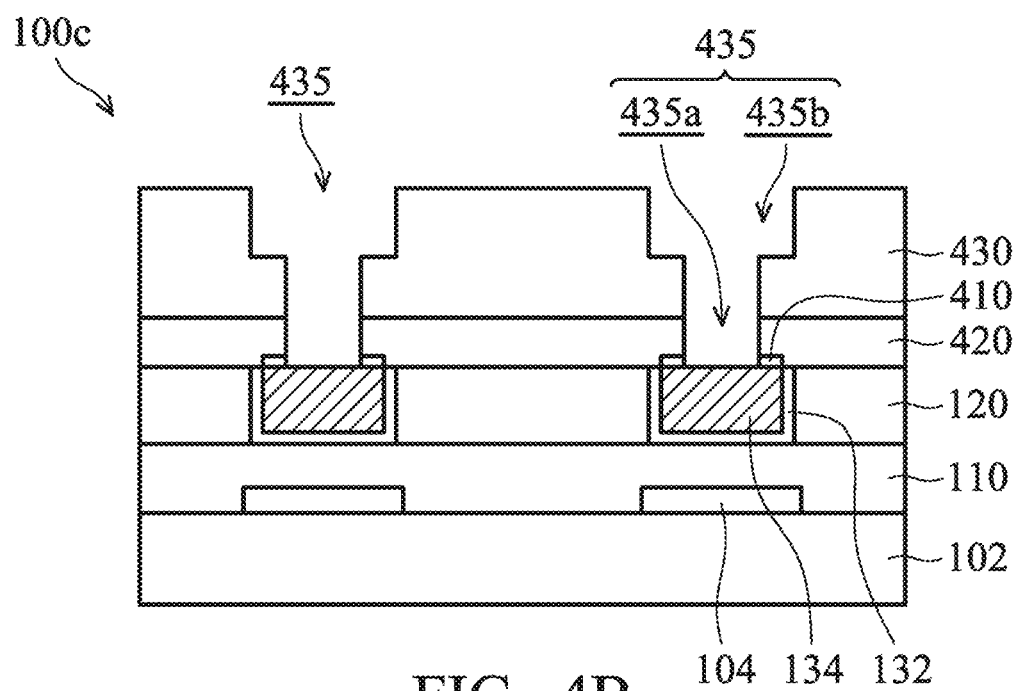
Figure 4C:
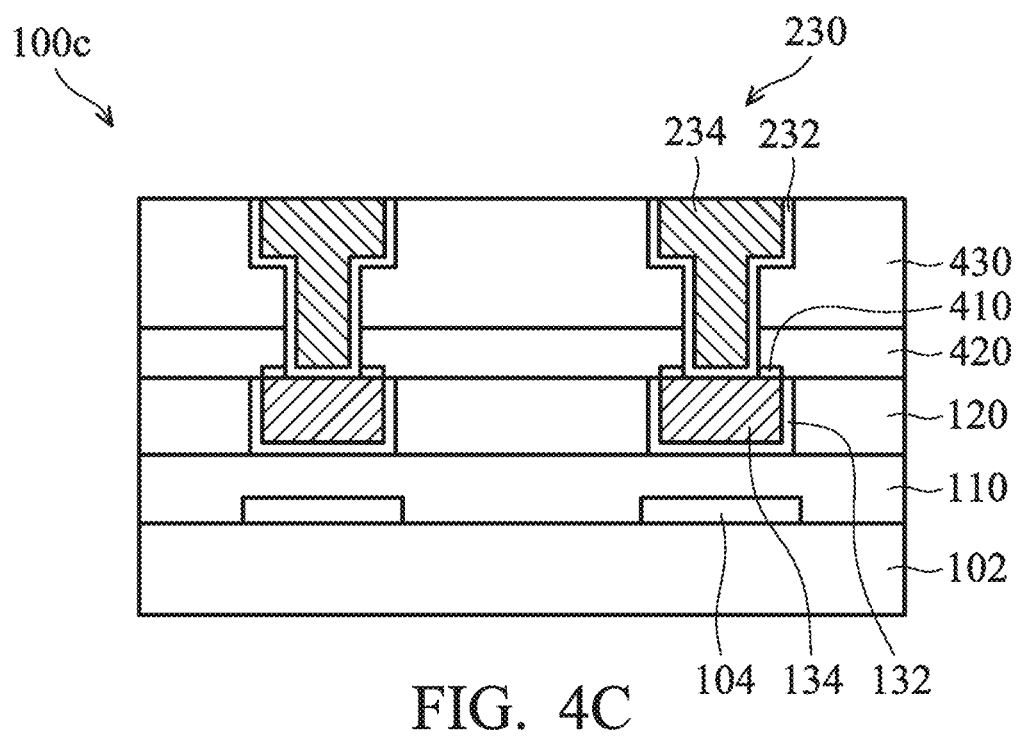

FIGS. 4A-4C show cross-sectional representations of various stages of forming a semiconductor device structure 100c, in accordance with some embodiments of the disclosure. Processes and materials used to form semiconductor structure 100c may be similar to, or the same as, those used to form the semiconductor structure 100a and are not repeated herein.

As shown in FIG. 4A, a capping layer 410 is formed over the conductive material 134. The capping layer 410 may be a dielectric capping layer or a metal capping layer. In some embodiments, the dielectric capping layer is made of silicon nitride (e.g., SiN), silicon oxynitride (e.g., SiON), silicon carbide (e.g., SiC), silicon oxycarbide (e.g., SiOC or SiCO), silicon carbide nitride (e.g., SiCN), another applicable materials or combinations thereof. In some embodiments, the metal capping layer is made of nickel (Ni), nickel boron (NiB), nickel-tungsten-boron (NiWB), cobalt (Co), cobalt-tungsten-boron (CoWB), cobalt-tungsten-phosphide (CoWP), NiReP, another applicable materials or combinations thereof.

It will be appreciated that the stoichiometry of the respective dielectric capping layer or metal capping layer may be varied according to chemical vapor deposition (CVD) processing variables, including the altering of relative ratios of reactants to achieve a desired compressive stress of the film.

After the capping layer 410 is formed, an etch stop layer 420 is formed over the capping layer 410 and the second dielectric layer 120 as shown in FIG. 4B, in accordance with some embodiments of the disclosure.

The etch stop layer 420 may be a single layer or multiple layers. The etch stop layer 420 is made of silicon carbide (SiC), silicon nitride (SixNy), silicon carbonitride (SiCN), silicon oxycarbide (SiOC), silicon oxycarbon nitride (SiOCN), or another applicable material. In some embodiments, the etch stop layer 420 has a bi-layer structure which includes a silicon oxide ($SiO_x$) layer formed on a silicon carbide (SiC) layer. The silicon oxide ($SiO_x$) layer has better moisture prevention than a silicon carbide (SiC) layer. In addition, a SiC layer is used to improve adhesion between the underlying layer and the SiOx layer.

After the etch stop layer 420 is formed, a third dielectric layer 430 is formed over the etch stop layer 420. In some embodiments, the third dielectric layer 430 may be the same as the second dielectric layer 120. In some embodiments, the third dielectric layer 430 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay.

Afterwards, a trench-via structure 435 for use as a dual damascene cavity is formed in the third dielectric layer 430. The trench-via structure 435 includes a via hole 435a and a first trench hole 435b. In some embodiments, the trench-via structure 435 is formed by two-patterning-two-etching (2P2E) process.

After the trench-via structure 435 is formed, a diffusion barrier layer 232 and a conductive material 234 are sequentially formed in the trench-via structure 435, as shown in FIG. 4C, in accordance with some embodiments of the disclosure. Afterwards, a polishing process is performed on the diffusion barrier layer 232 and the conductive material 234 to remove the excess materials. The diffusion barrier layer 232 and the conductive material 234 collectively constitute dual damascene structure.

The conductive material 234 includes twin boundaries to improve the electromigration (EM) reliability and the stress migration (SM) reliability without causing high resistivity. In some embodiments, the twin boundaries have a twin density in a range from about 25 $\mu m^{-1}$ to about 250 $\mu m^{-1}$. In some embodiments, the twin boundaries have a twin-lamella width in a range from about 4 nm to about 40 nm It should be noted that the conductive material 234 is electrically connected to the conductive material 134, and both have high twin density to reduce the electromigration (EM) and the stress migration (SM).

Figure 5A:
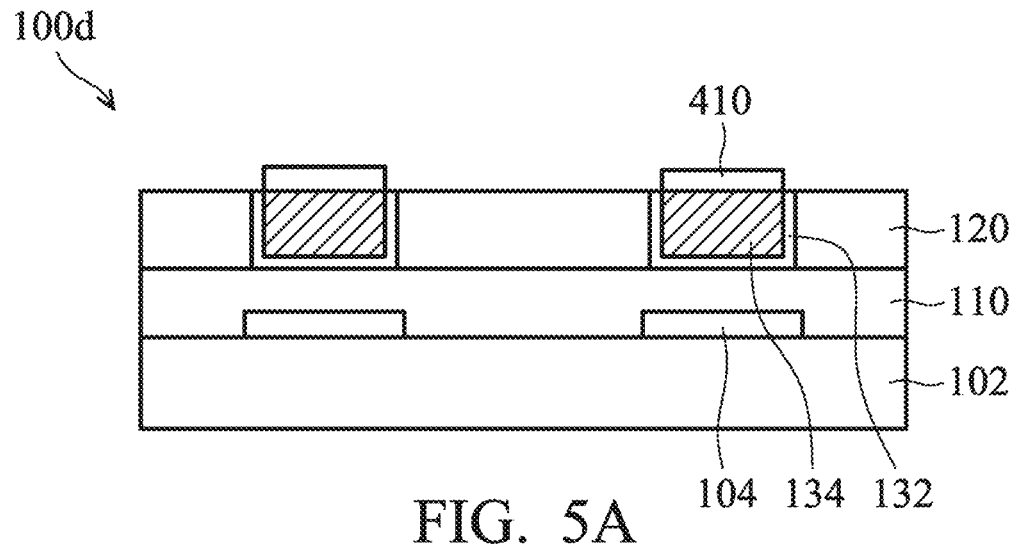
FIGS. 5A-5B show cross-sectional representations of various stages of forming a semiconductor device structure, in accordance with some embodiments of the disclosure.
Figure 5B:
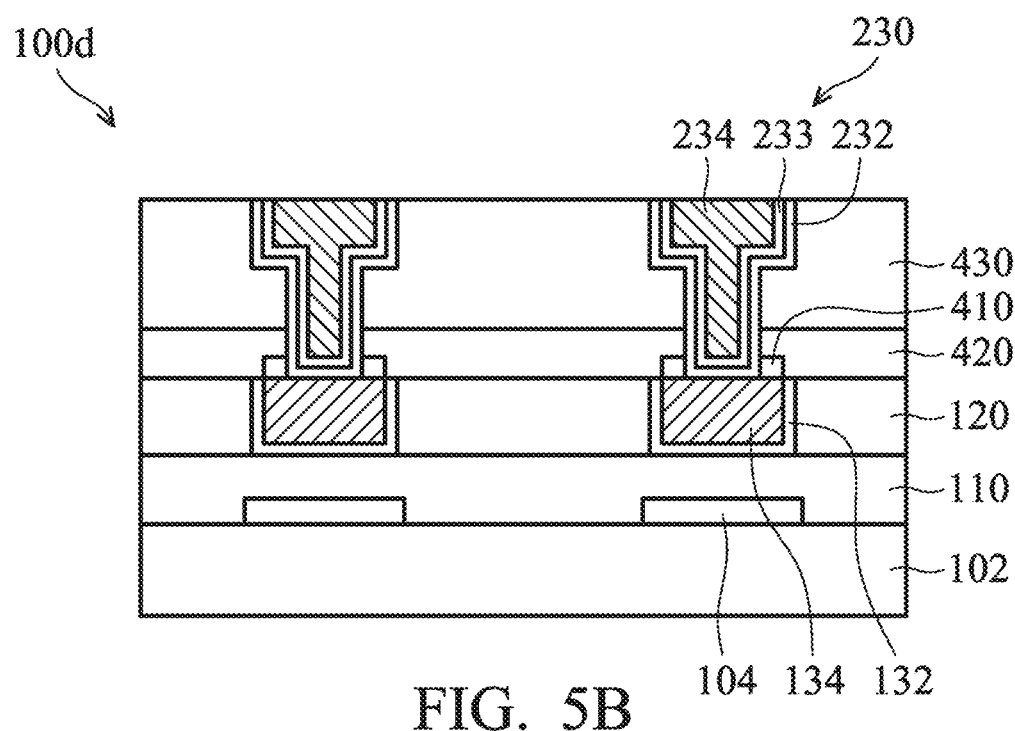

FIGS. 5A-5B show cross-sectional representations of various stages of forming a semiconductor device structure 100d, in accordance with some embodiments of the disclosure. Processes and materials used to form semiconductor structure 100d may be similar to, or the same as, those used to form the semiconductor structure 100a and are not repeated herein.

As shown in FIG. 5A, the capping layer 410 is formed over the conductive material 134. In some embodiments, the capping layer 410 is made of metal or alloy, and it is formed by an electroplating process.

Afterwards, the etch stop layer 420, the third dielectric layer 430 are formed over the capping layer 410. A trench-via structure is formed through the third dielectric layer 430, the etch stop layer 420 and the capping layer 430. Afterwards, the diffusion barrier layer 232, the glue layer 233 and the conductive material 234 are formed in the trench-via structure as shown in FIG. 5B, in accordance with some embodiments of the disclosure. Therefore, the dual-damascene conductive structure 230 is obtained.

Figure 6:
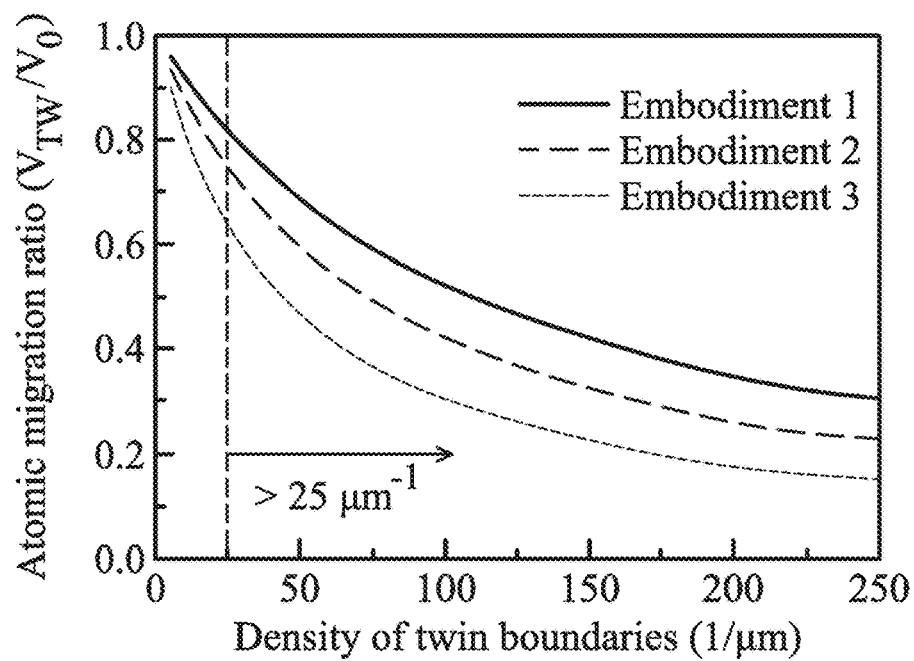
FIG. 6 shows a relationship of the density of the twin boundaries of the conductive material and the atomic migration ratio ($V_{TM}/V_0$), in accordance with some embodiments of the disclosure.

FIG. 6 shows a relationship of the density of the twin boundaries of the conductive material 134 and the atomic migration ratio ($V_{TM}/V_O$), in accordance with some embodiments of the disclosure.

The date shown in FIG. 6 is obtained by in-situ TEM. The conductive material 134 is made of copper (Cu). The X-axis shows the density the twin boundaries of the conductive material (such as conductive materials 134 and 234). The Y-axis shows a ratio of a migration rate (marked as $V_{TM}$) of the conductive materials with twin boundaries to a migration rate (marked as $V_O$) of the materials without twin boundaries. The Cu atom migration is delayed by each twin boundaries of the conductive material for two seconds (marked as Embodiment 1), three seconds (marked as Embodiment 2) and five seconds (marked as Embodiment 3). The conductive material of Embodiments 1, 2 and 3 are made of copper (Cu).

As shown in FIG. 6, as the density the twin boundaries of the conductive material made of copper (Cu) is increased, the migration rate of the conductive material is gradually reduced. When the density the twin boundaries of the conductive material is at a constant value, the migration rate of conductive material is reduced as the delayed time of the migrating Cu atoms is increased. In other words, the migration rate of the conductive material 134 is decreased by the twin boundaries. Therefore, when the density the twin boundaries of the conductive material 134 is in a range from about 25 $\mu m^{-1}$ to about 250 $\mu m^{-1}$, the electro migration (EM) is effectively suppressed. Therefore, the reliability of the interconnect structure is improved when the conductive material is formed by high density twin boundaries FIG. 7 shows a relationship of the twin-lamella width of the twin boundaries of the conductive material and failure current density, in accordance with some embodiments of the disclosure.

Figure 7:
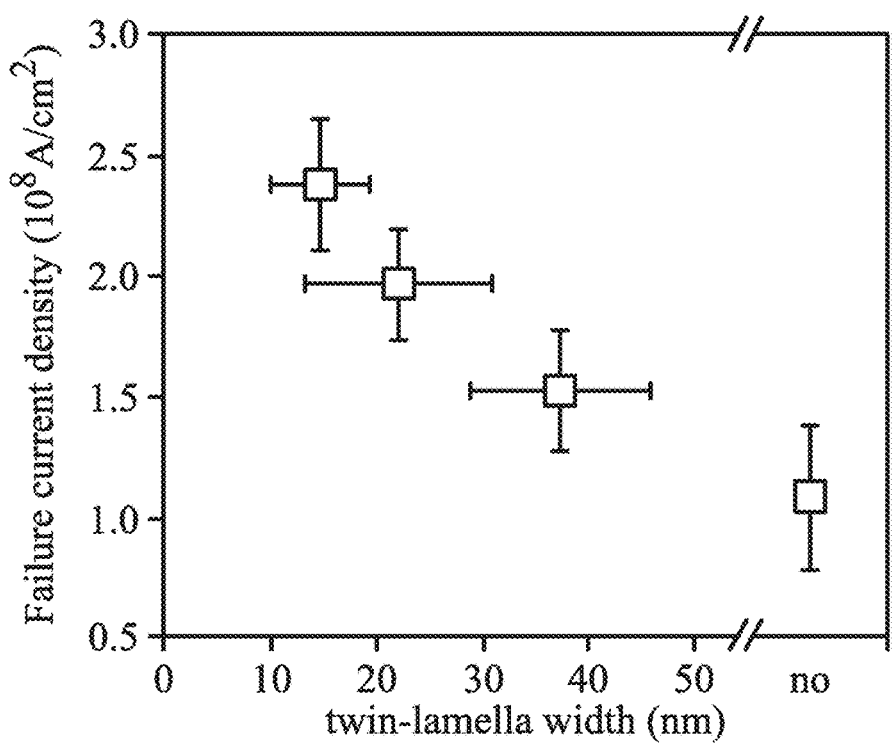
FIG. 7 shows a relationship of the twin-lamella width of the twin boundaries of the conductive material and failure current density, in accordance with some embodiments of the disclosure.

The date shown in FIG. 7 is obtained by TEM for twin-lamella width (spacing of twin boundaries). The X-axis shows the twin-lamella width of the conductive material made of copper (Cu) (such as conductive materials 134 and 234). The "no" in X-axis means that the conductive material has no twin boundaries. The Y-axis shows a failure current density, and the unit is $10^8$ A/cm$^2$.

As shown in FIG. 7, as the twin-lamella width of the twin boundaries of the conductive material is decreased, the failure current density is increased. In other words, the twin boundaries of the conductive material with a smaller twin-lamella width have a higher withstand current.

Figure 8A:
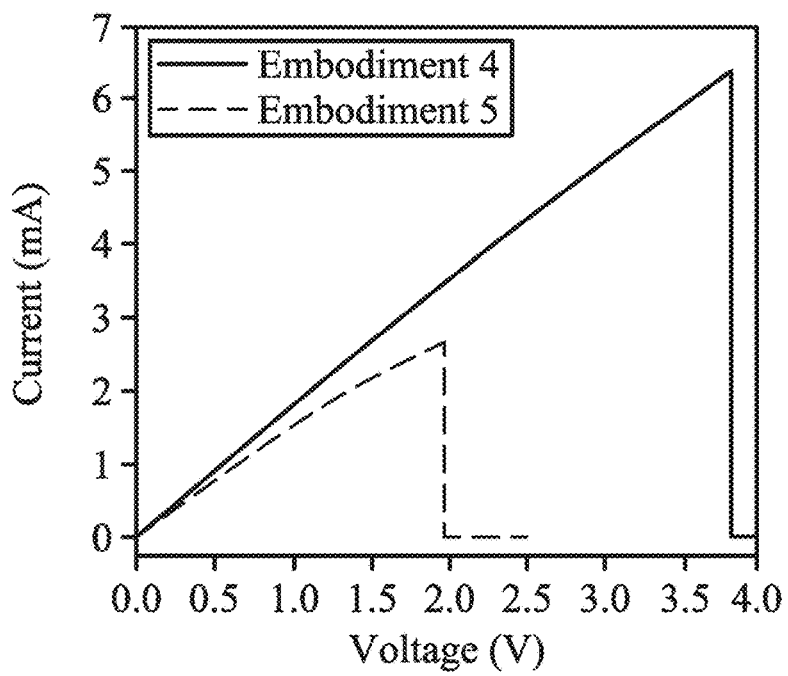
FIGS. 8A-8B show a relationship of voltage and current of the conductive materials with twin boundaries (marked as Embodiment 4) and without twin boundaries (marked as Embodiment 5).
Figure 8B:
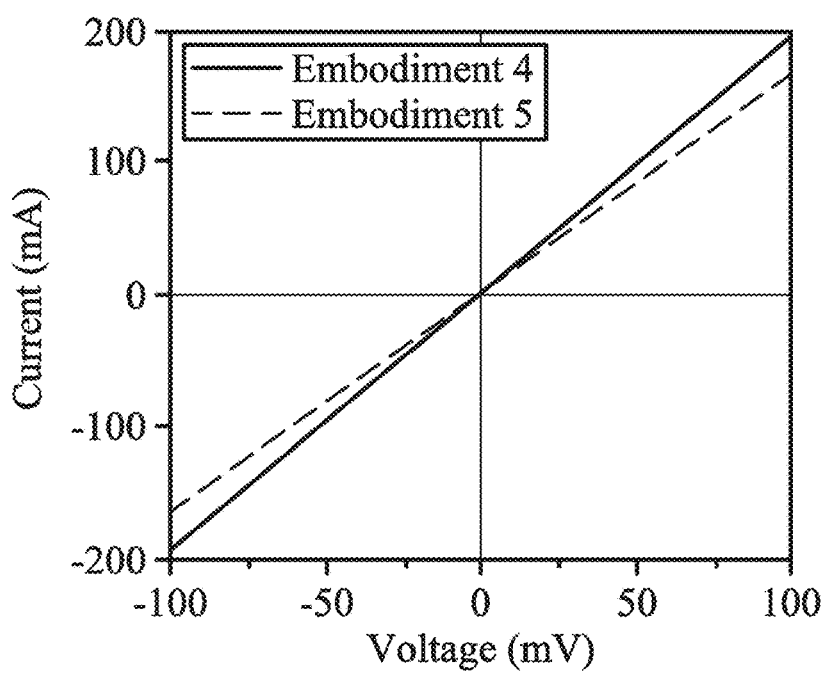

FIGS. 8A and 8B show relationships of voltage and current of the conductive materials with twin boundaries (marked as Embodiment 4) and without twin boundaries (marked as Embodiment 5).

When a voltage is applied to the conductive material (such as conductive materials 134 and 234), the current of the conductive material is measured. As shown in FIG. 8A, Embodiment 4 has a higher withstand current than Embodiment 5.

The two lines shown in FIG. 8B mean that the resistances of the conductive material. The slope of Embodiment 4 is similar to that of the Embodiment 5. Therefore, the resistance of Embodiment 4 is close to the resistance of Embodiment 5, the resistance of the original property of the conductive material is not changed by the twin boundaries. The twin boundaries of the conductive material improve the electro migration (EM) reliability and the stress migration (SM) reliability without causing high resistivity.

In an embodiment, a method of forming a semiconductor device structure includes: forming a first conductive structure over a substrate, the first conductive structure including twin boundaries; and wherein the forming the first conductive structure includes manipulating process conditions so as to promote formation of the twin boundaries resulting in a promoted density of twin boundaries such that the first conductive structure has an increased failure current density (FCD) relative to a baseline FCD of an otherwise substantially corresponding second conductive structure which has an unpromoted density of twin boundaries, the unpromoted density being less than the promoted density, and such that the first conductive structure has a resistance which is substantially the same as the second conductive structure. In an embodiment, the forming a conductive structure over the substrate includes performing a pulse current type of electrodeposition process. In an embodiment, a spacing between a first twin boundary and a second twin boundary is a twin-lamella width; and the forming a conductive structure includes manipulating process conditions so as to promote formation of twin-lamella widths within a range. In an embodiment, the forming the first conductive structure over the substrate includes: forming a diffusion barrier layer; and forming a conductive material formed over the diffusion barrier layer, wherein a lattice mismatch ratio between a lattice constant of the diffusion barrier layer and a lattice constant of the conductive material is in a range from about 0.1% to about 6%. In an embodiment, the method further includes: forming a glue layer between the diffusion barrier layer and the conductive material, wherein a lattice mismatch ratio between a lattice constant of the glue layer and a lattice constant of the conductive material is in a range from about 0.1% to about 6%. In an embodiment, the method further includes: forming a via-trench structure over the conductive structure, wherein the via-trench structure includes twin boundaries, and a density of the twin boundaries in a range from about 25 $\mu m^{-1}$ to about 250 $\mu m^{-1}$. In an embodiment, the manipulating process conditions achieves a density of the twin boundaries which is in a range from about 25 $\mu m^{-1}$ to about 250 $\mu m^{-1}$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for forming a semiconductor device structure, the method comprising:
    forming a first conductive structure over a substrate, the first conductive structure including twin boundaries; and wherein the forming the first conductive structure includes:
  manipulating process conditions so as to promote formation of the twin boundaries resulting in a promoted density of twin boundaries such that:
    the first conductive structure has an increased failure current density (FCD) relative to a baseline FCD of an otherwise substantially corresponding second conductive structure which has an unpromoted density of twin boundaries, the unpromoted density being less than the promoted density; and
    the first conductive structure has an ohmic resistance which is substantially the same as the second conductive structure.

2. The method of claim 1, wherein the forming a first conductive structure further includes:
  performing a pulse current type of electrodeposition process.

3. The method of claim 2, wherein:
  a spacing between a first twin boundary and a second twin boundary is a twin-lamella width; and
  the forming a first conductive structure further includes:
    manipulating process conditions so as to promote formation of twin-lamella widths within a range.

4. The method of claim 1, wherein the forming the first conductive structure further includes:
  forming a diffusion barrier layer; and
  forming a conductive material over the diffusion barrier layer, wherein a lattice mismatch ratio between a lattice constant of the diffusion barrier layer and a lattice constant of the conductive material is in a range from about 0.1% to about 6%.

5. The method of claim 4, further comprising:
  forming a glue layer between the diffusion barrier layer and the conductive material, wherein a lattice mismatch ratio between a lattice constant of the glue layer and the lattice constant of the conductive material is in a range from about 0.1% to about 6%.

6. The method of claim 1, further comprising:
  forming a via-trench structure over the first conductive structure, wherein the via-trench structure includes twin boundaries, and a density of the twin boundaries is in a range from about 25 $\mu m^{-1}$ to about 250 $\mu m^{-1}$.

7. The method of claim 1, wherein:
  the manipulating process conditions achieves a density of the twin boundaries which is in a range from about 25 $\mu m^{-1}$ to about 250 $\mu m^{-1}$.

8. A method for forming a semiconductor device structure, the method comprising:
  forming a first conductive structure over a substrate, the first conductive structure including twin boundaries; and
  wherein:
    a spacing between a first twin boundary and a second twin boundary is a twin-lamella width; and
    the forming the first conductive structure includes:
      manipulating process conditions so as to promote formation of a first range of twin-lamella widths such that:
        the first conductive structure has an increased failure current density (FCD) relative to a baseline FCD of an otherwise substantially corresponding second conductive structure which has an unpromoted second range of twin-lamella widths ;
        a measure of central tendency of the first range is smaller than the measure of central tendency of the second range; and
        the first conductive structure has an ohmic resistance which is substantially the same as the second conductive structure.

9. The method of claim 8, wherein:
  the measure of central tendency is average twin-lamella width.

10. The method of claim 9, wherein:
  the average twin-lamella width of the first range is from about 4 nm to about 40 nm.

11. The method of claim 8, wherein the forming a conductive structure further includes:
  performing a pulse current type of electrodeposition process.

12. The method of claim 8, wherein the forming the first conductive structure further includes:
  forming a diffusion barrier layer; and
  forming a conductive material formed over the diffusion barrier layer, wherein a lattice mismatch ratio between a lattice constant of the diffusion barrier layer and a lattice constant of the conductive material is in a range from about 0.1% to about 6%.

13. The method of claim 12, further comprising:
  forming a glue layer between the diffusion barrier layer and the conductive material, wherein a lattice mismatch ratio between a lattice constant of the glue layer and the lattice constant of the conductive material is in a range from about 0.1% to about 6%.

14. The method of claim 8, further comprising:
  forming a via-trench structure over the first conductive structure, wherein the via-trench structure includes twin boundaries, and a density of the twin boundaries is in a range from about 25 $\mu m^{-1}$ to about 250 $\mu m^{-1}$.

15. The method of claim 8, wherein:
  the manipulating process conditions achieves a density of the twin boundaries which is in a range from about 25 $\mu m^{-1}$ to about 250 $\mu m^{-1}$.

16. The method of claim 3, wherein:
  the range is a range of values of average twin-lamella width; and
  the range is from about 4 nm to about 40 nm.

17. A method for forming a semiconductor device structure, the method comprising:
  forming a first conductive structure over a substrate, the first conductive structure including twin boundaries; and
  forming a via-trench structure over the first conductive structure, the via-trench structure including twin boundaries; and
  wherein the forming the first conductive structure includes:
    manipulating process conditions so as to promote formation of the twin boundaries resulting in a promoted density of twin boundaries such that:
      the first conductive structure has an increased failure current density (FCD) relative to a baseline FCD of an otherwise substantially corresponding second conductive structure which has an unpromoted density of twin boundaries, the unpromoted density being less than the promoted density; and
      the first conductive structure has an ohmic resistance which is substantially the same as the second conductive structure.

18. The method of claim 17, wherein:
a density of the twin boundaries is in a range from about 25 $\mu m^{-1}$ to about 250 $\mu m^{-1}$.

19. The method of claim 17, wherein:
a spacing between a first twin boundary and a second twin boundary is a twin-lamella width; and
the manipulating process conditions includes:
   promoting formation of twin-lamella widths having a measure of central tendency within a range.

20. The method of claim 19, wherein:
the measure of central tendency is average twin-lamella width.

* * * * *